(12) United States Patent
Ku et al.

(10) Patent No.: US 9,786,980 B2
(45) Date of Patent: Oct. 10, 2017

(54) ANTENNA SYSTEM

(71) Applicant: Wistron NeWeb Corp., Hsinchu (TW)

(72) Inventors: Kuang-Yuan Ku, Hsinchu (TW); Cheng-Geng Jan, Hsinchu (TW); Huang-Tse Peng, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 1 day.

(21) Appl. No.: 15/135,289

(22) Filed: Apr. 21, 2016

(65) Prior Publication Data
US 2017/0084985 A1    Mar. 23, 2017

(30) Foreign Application Priority Data

Sep. 23, 2015  (TW) .............................. 104131374 A

(51) Int. Cl.
 H01Q 1/24    (2006.01)
 H03H 7/38    (2006.01)
 H01Q 1/52    (2006.01)
 H01Q 1/48    (2006.01)
 H01Q 21/28   (2006.01)

(52) U.S. Cl.
 CPC .............. *H01Q 1/243* (2013.01); *H01Q 1/48* (2013.01); *H01Q 1/521* (2013.01); *H01Q 1/523* (2013.01); *H01Q 1/526* (2013.01); *H01Q 21/28* (2013.01); *H03H 7/38* (2013.01)

(58) Field of Classification Search
 CPC ........ H01Q 1/521; H01Q 1/523; H01Q 1/526; H01Q 1/243; H01Q 1/48; H01Q 21/28
 See application file for complete search history.

(56) References Cited

U.S. PATENT DOCUMENTS

| | | | |
|---|---|---|---|
| 6,624,789 B1 | 9/2003 | Kangasvieri et al. | |
| 8,085,202 B2 | 12/2011 | Ayatollahi et al. | |
| 2009/0009400 A1 | 1/2009 | Kim et al. | |
| 2012/0194391 A1 | 8/2012 | Liu et al. | |
| 2012/0212389 A1* | 8/2012 | Aizawa ................... | H01Q 1/36 343/853 |

(Continued)

FOREIGN PATENT DOCUMENTS

| | | |
|---|---|---|
| CN | 102694246 A | 9/2012 |
| CN | 103268987 A | 8/2013 |

(Continued)

*Primary Examiner* — Hoang Nguyen
(74) *Attorney, Agent, or Firm* — McClure, Qualey & Rodack, LLP

(57) ABSTRACT

An antenna system includes a ground metal element, a first signal source, a first antenna, a second signal source, a second antenna, an isolation metal element, and a matching circuit. The first signal source is connected to the ground metal element. The first antenna is connected to the first signal source. The first signal source is configured to excite the first antenna. The second signal source is connected to the ground metal element. The second antenna is connected to the second signal source. The second signal source is configured to excite the second antenna. The isolation metal element is disposed between the first antenna and the second antenna, and is configured to improve the isolation between the first antenna and the second antenna. The matching circuit is connected between the isolation metal element and the ground metal element.

8 Claims, 14 Drawing Sheets

(56) References Cited

U.S. PATENT DOCUMENTS

| | | | |
|---|---|---|---|
| 2013/0162496 A1* | 6/2013 | Wakabayashi | H01Q 21/00 343/853 |
| 2014/0049445 A1 | 2/2014 | Tu | |
| 2014/0085158 A1 | 3/2014 | Wong et al. | |
| 2014/0139392 A1* | 5/2014 | Wong | H01Q 1/523 343/841 |
| 2014/0242903 A1 | 8/2014 | DeLuis et al. | |

FOREIGN PATENT DOCUMENTS

| | | |
|---|---|---|
| CN | 103811868 A | 5/2014 |
| TW | 538561 B | 6/2003 |
| TW | 554566 B | 9/2003 |
| TW | M382604 U1 | 6/2010 |
| TW | 201511481 A | 3/2015 |

* cited by examiner

ANTENNA SYSTEM

CROSS REFERENCE TO RELATED APPLICATIONS

This Application claims priority of Taiwan Patent Application No. 104131374 filed on Sep. 23, 2015, the entirety of which is incorporated by reference herein.

BACKGROUND OF THE INVENTION

Field of the Invention

The disclosure generally relates to an antenna system, and more particularly, to an antenna system for improving isolation.

Description of the Related Art

With advancement in mobile communication technology, mobile devices such as portable computers, mobile phones, multimedia players, and other hybrid functional portable electronic devices have become more common. To satisfy user demands, having wireless communication functions implemented in mobile devices is a must. Some devices cover a large range of wireless communication fields; these include mobile phones using 2G, 3G, and LTE (Long Term Evolution) systems with frequency bands of 700 MHz, 850 MHz, 900 MHz, 1800 MHz, 1900 MHz, 2100 MHz, 2300 MHz, and 2500 MHz. On the contrary, some devices cover a relatively small range of wireless communication fields; these include mobile phones using Wi-Fi and Bluetooth systems and using frequency bands of 2.4 GHz, 5.2 GHz, and 5.8 GHz.

An antenna system is indispensable in a mobile device supporting wireless communication. However, since the interior space of a mobile device is very limited, multiple antennas are usually disposed close to each other, and such a design causes serious interference between antennas. As a result, there is a need to design a new antenna system for solving the problem of bad isolation in a conventional antenna system.

BRIEF SUMMARY OF THE INVENTION

In a preferred embodiment, the disclosure is directed to an antenna system including a ground metal element, a first signal source, a first antenna, a second signal source, a second antenna, an isolation metal element, and a matching circuit. The first signal source is connected to the ground metal element. The first antenna is connected to the first signal source. The first signal source is configured to excite the first antenna. The second signal source is connected to the ground metal element. The second antenna is connected to the second signal source. The second signal source is configured to excite the second antenna. The isolation metal element is disposed between the first antenna and the second antenna, and is configured to improve the isolation between the first antenna and the second antenna. The matching circuit is connected between the isolation metal element and the ground metal element.

In some embodiments, the isolation metal element has a connection end and an open end. The connection end of the isolation metal element is connected through the matching circuit to the ground metal element.

In some embodiments, the isolation metal element is symmetrical with respect to a central line of the antenna system.

In some embodiments, the matching circuit includes an inductor.

In some embodiments, the matching circuit includes a capacitor.

In some embodiments, the isolation metal element has a T-shape, a straight-line shape, a T-shape with bending ends, an interdigitated shape, a spiral shape, or a meandering shape.

In some embodiments, the first antenna and the second antenna cover the same operation frequency band.

In some embodiments, any of the first antenna and the second antenna is a monopole antenna, a dipole antenna, a patch antenna, a loop antenna, a spiral antenna, a chip antenna, or a hybrid antenna.

In some embodiments, the antenna system further includes a transmission line. The connection end of the isolation metal element is connected through the matching circuit and the transmission line to the ground metal element. The transmission line is configured to fine-tune a resonant frequency band of the isolation metal element.

In some embodiments, the transmission line is a CPW (Coplanar Waveguide).

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows.

Figure 1:
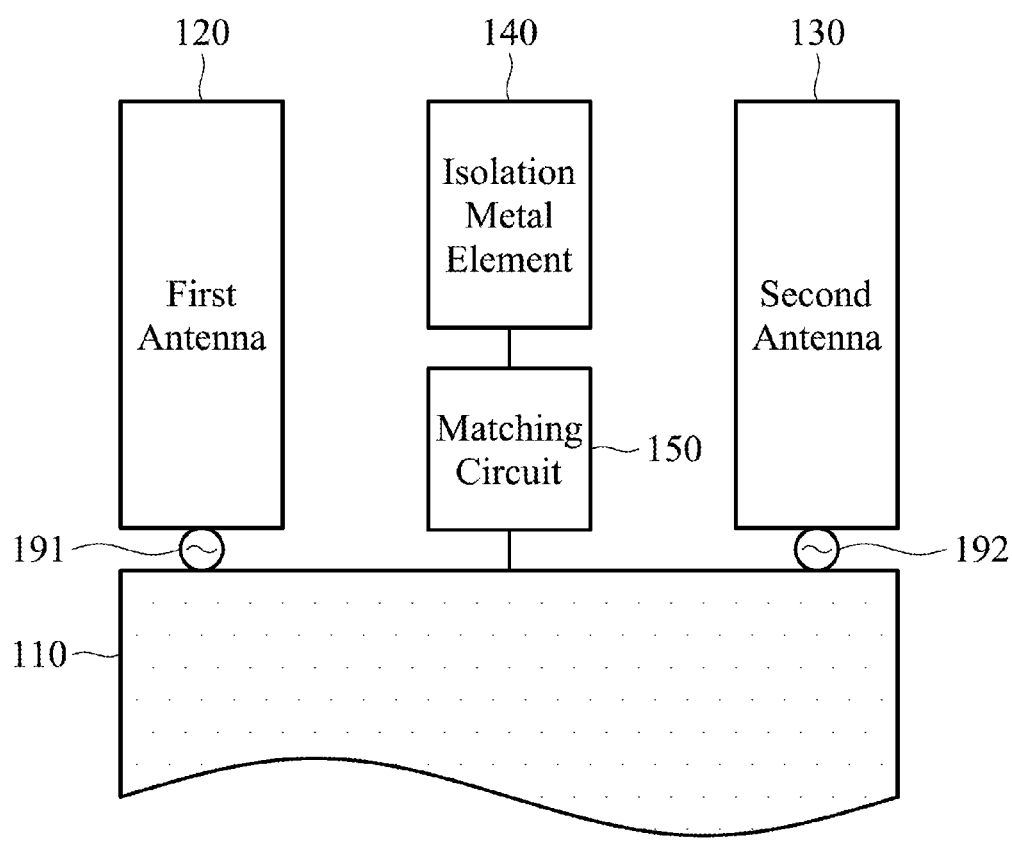
FIG. 1 is a diagram of an antenna system according to an embodiment of the invention.

FIG. 1 is a diagram of an antenna system 100 according to an embodiment of the invention. The antenna system 100 is applicable to a mobile device, such as a smartphone, a tablet computer, a USB (Universal Serial Bus) dongle, a mobile hotspot, or a notebook computer. As shown in FIG. 1, the antenna system 100 at least includes a ground metal element 110, a first antenna 120, a second antenna 130, an isolation metal element 140, and a matching circuit 150. The ground metal element 110, the first antenna 120, the second antenna 130, and the isolation metal element 140 may be made of copper, silver, aluminum, iron, or their alloys, but they are not limited thereto. The ground metal element 110 may be disposed on an upper surface or a lower surface of a dielectric substrate, such as a system circuit board or an FR4 (Flame Retardant 4) substrate. The types and shapes of the first antenna 120 and the second antenna 130 are not limited to the present disclosure. For example, either the first antenna 120 or the second antenna 130 may be a monopole antenna, a dipole antenna, a patch antenna, a loop antenna, a spiral antenna, a chip antenna, or a hybrid antenna. The first antenna 120 is excited by a first signal source 191. The first signal source 191 is connected between the first antenna 120 and the ground metal element 110. The second antenna 130 is excited by a second signal source 192. The second signal source 192 is connected between the second antenna 130 and the ground metal element 110. The first antenna 120 and the second antenna 130 cover the same operation frequency band. For example, the first antenna 120 can be used as the main antenna of a mobile device, and the second antenna 130 can be used as an auxiliary antenna of the mobile device. The main antenna and the auxiliary antenna operate in the same frequency band, so as to enhance the diversity of the antenna system 100. Since the first antenna 120 and the second antenna 130 easily interfere with each other, the isolation between the two antennas 120 and 130 is to be enhanced. For doing so, the isolation metal element 140 is disposed between the first antenna 120 and the second antenna 130. Preferably, the isolation metal element 140 has a symmetrical structure with respect to a straight line. The matching circuit 150 is coupled between the isolation metal element 140 and the ground metal element 110, and is configured to fine-tune the effective resonant length of the isolation metal element 140. It should be understood that the matching circuit 150 helps to shorten the total length of the isolation metal element 140 and minimize the total area of the antenna system 100. The detailed structure and function of the matching circuit 150 will be described in the following embodiments.

Figure 2A:
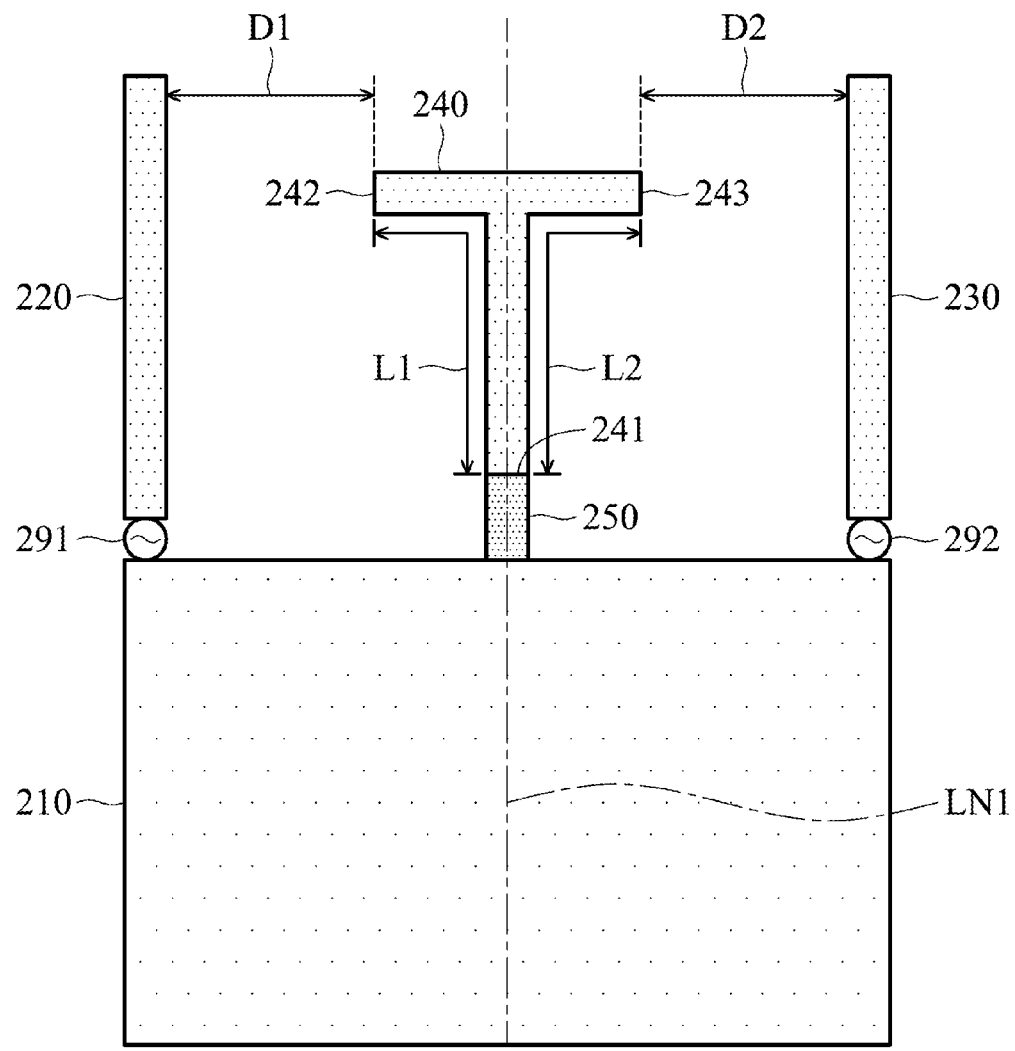
FIG. 2A is a diagram of an antenna system according to an embodiment of the invention.

FIG. 2A is a diagram of an antenna system 200 according to an embodiment of the invention. FIG. 2A is similar to FIG. 1. In the embodiment of FIG. 2A, the antenna system 200 includes a ground metal element 210, a first antenna 220, a second antenna 230, an isolation metal element 240, and a matching circuit 250. The ground metal element 210 is a rectangular metal plane. The first antenna 220 and the second antenna 230 are monopole antennas, and they are excited by a first signal source 291 and a second signal source 292, respectively. The isolation metal element 240 is symmetrical with respect to a central line LN1 of the antenna system 200. For example, the isolation metal element 240 may have a T-shape, a straight-line shape, a T-shape with bending ends, an interdigitated shape, a spiral shape, or a meandering shape, but it is not limited thereto. The isolation metal element 240 has a connection end 241 and two open ends 242 and 243. The connection end 241 of the isolation metal element 240 is connected through the matching circuit 250 to an edge of the ground metal element 210. The open ends 242 and 243 of the isolation metal element 240 are extended in opposite directions. Generally, in order to reduce interference between the first antenna 220 and the second antenna 230, the isolation metal element 240 resonates with the first antenna 220 and the second antenna 230 in the same frequency band, so as to attract surface currents on the ground metal element 210 and increase the isolation of the antenna system 200. For example, a left branch (from the connection end 241 to the open end 242) of the isolation metal element 240 may have a length L1 equal to ¼ wavelength (λ/4) of the operation frequency band of the first antenna 220 and the second antenna 230. A right branch (from the connection end 241 to the open end 243) of the isolation metal element 240 may have a length L2 equal to ¼ wavelength of the operation frequency band of the first antenna 220 and the second antenna 230. However, if the first antenna 220 and the second antenna 230 operate in a relatively low frequency band, the aforementioned design may over occupying the space in the mobile device. In order to solve these drawbacks, an alternative embodiment of the present invention further proposes to add a matching circuit 250 between the connection end 241 of the isolation metal element 240 and the ground metal element 210. The matching circuit 250 is configured to fine-tune the resonant length of the isolation metal element 240, so that the length L1 of the left branch and the length L2 of the right branch are both reduced to less than ¼ wavelength (e.g., ⅙ wavelength or ⅛ wavelength) of the operation frequency band of the first antenna 220 and the second antenna 230. The total size of the antenna system 200 is minimized accordingly.

Figure 2B:
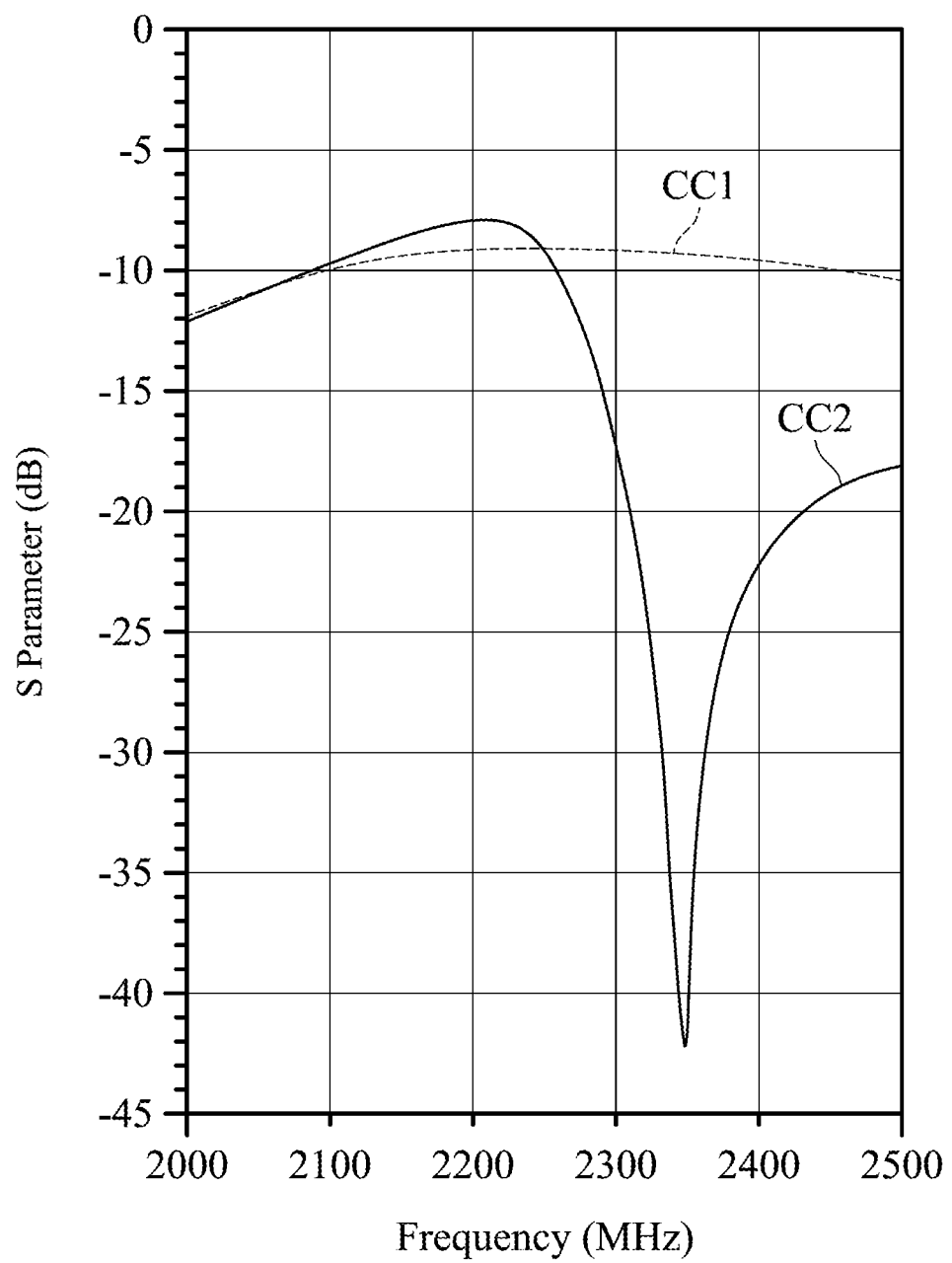
FIG. 2B is a diagram of S-parameters of an antenna system according to an embodiment of the invention.

FIG. 2B is a diagram of S-parameters of the antenna system 200 according to an embodiment of the invention. The horizontal axis represents the operation frequency (MHz), and the vertical axis represents the S-parameters (dB). If the first antenna 220 is set to a first port (Port 1) and the second antenna 230 is set to a second port (Port 2), the isolation between the first antenna 220 and the second antenna 230 will be represented as S21 (or S12) parameter. In the embodiment of FIG. 2B, the operation frequency band of the first antenna 220 and the second antenna 230 is substantially from 2400 MHz to 2484 MHz. A first curve CC1 represents the S21 parameter between the first antenna 220 and the second antenna 230 without any isolation metal element. A second curve CC2 represents the S21 parameter between the first antenna 220 and the second antenna 230 when the antenna system 200 includes the isolation metal element 240 and the matching circuit 250. According to the comparison between the first curve CC1 and the second curve CC2, the S21 parameter of the antenna system 200 without the isolation metal element 240 may be about −9 dB over the frequency band from 2400 MHz to 2484 MHz, but the S21 parameter of the antenna system 200 with the isolation metal element 240 and the matching circuit 250 may be significantly improved to about −43 dB over the frequency band from 2400 MHz to 2484 MHz. The use of the proposed isolation metal element 240 and matching circuit 250 has at least the advantages of enhancing the isolation of the antenna system 200 and minimizing the total size of the antenna system 200, and it is suitable for application in a variety of small-size mobile devices.

In some embodiments, the element sizes of the proposed design are as follows. The spacing D1 between the first antenna 220 and the isolation metal element 240 should be longer than 10 mm. The spacing D2 between the second antenna 230 and the isolation metal element 240 should be longer than 10 mm. The width of the isolation metal element 240 is about 1 mm. The length L1 of the left branch of the isolation metal element 240 is about 15.5 mm. The length L2 of the right branch of the isolation metal element 240 is about 15.5 mm.

Figure 3A:
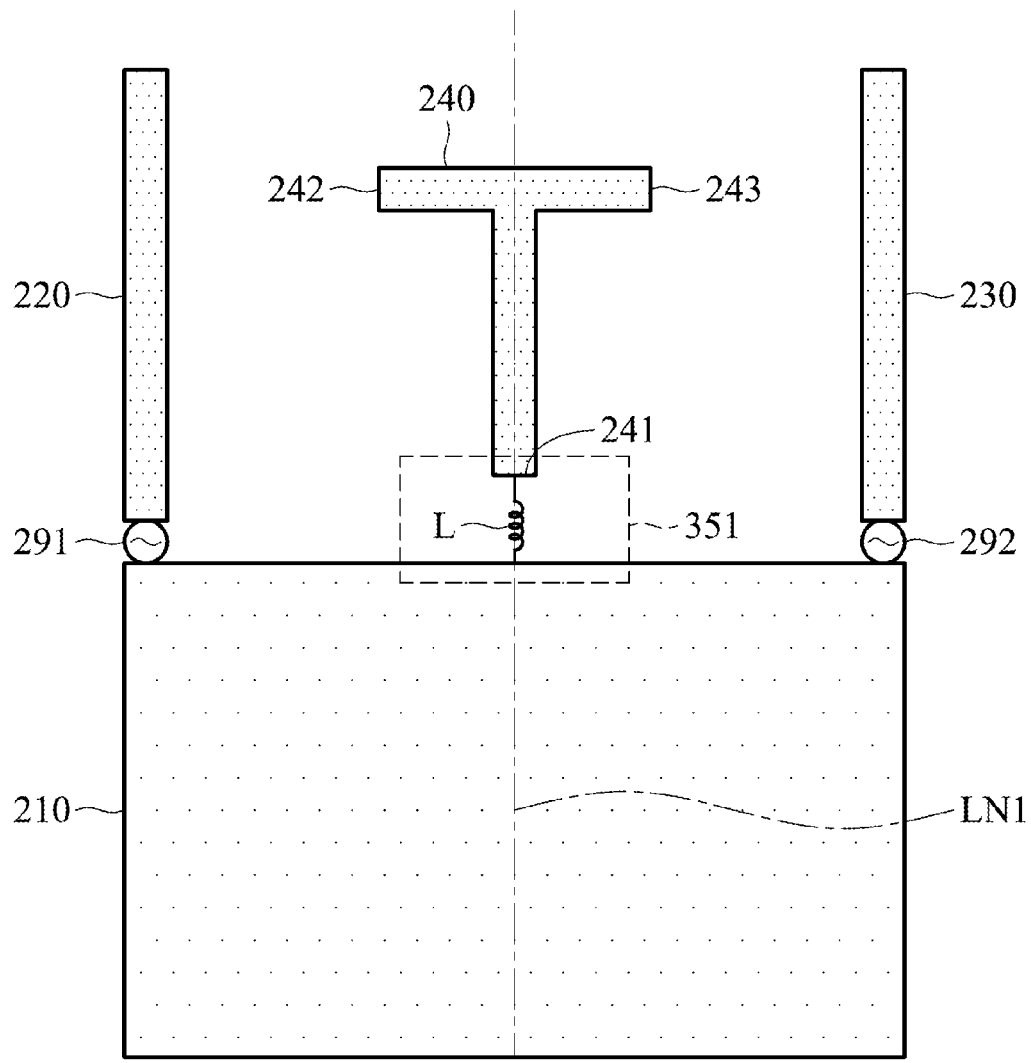
FIG. 3A is a diagram of an antenna system according to an embodiment of the invention.

FIG. 3A is a diagram of an antenna system 301 according to an embodiment of the invention. FIG. 3A is similar to FIG. 2A. In the embodiment of FIG. 3A, a matching circuit 351 of the antenna system 301 includes an inductor L. The inductor L is coupled between the connection end 241 of the isolation metal element 240 and the ground metal element 210, and is configured to fine-tune the effective resonant length of the isolation metal element 240. The inductance of the inductor L is from about 1 nH to about 20 nH. Other features of the antenna system 301 of FIG. 3A are similar to those of the antenna system 200 of FIG. 2A. Accordingly, the two embodiments can achieve similar levels of performance.

Figure 3B:
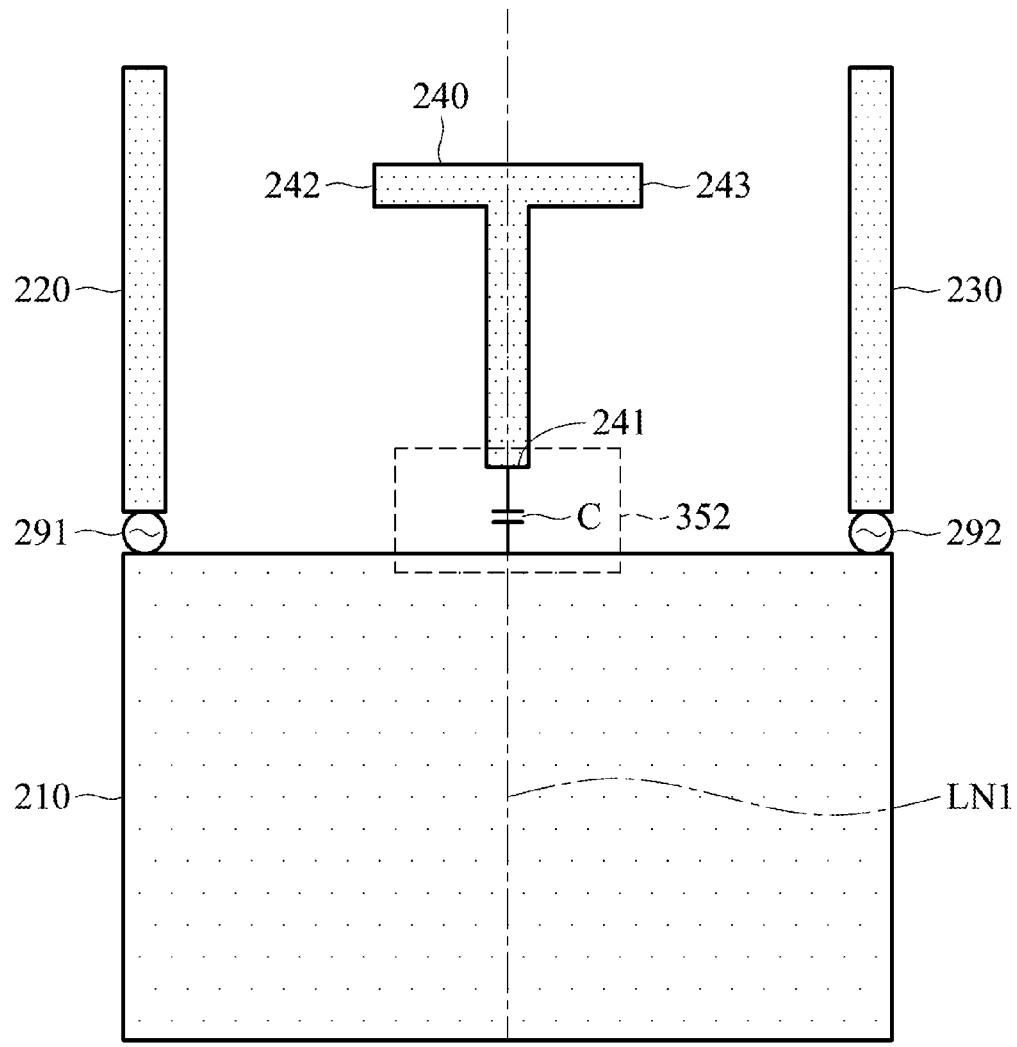
FIG. 3B is a diagram of an antenna system according to an embodiment of the invention.

FIG. 3B is a diagram of an antenna system 302 according to an embodiment of the invention. FIG. 3B is similar to FIG. 2A. In the embodiment of FIG. 3B, a matching circuit 352 of the antenna system 302 includes a capacitor C. The capacitor C is coupled between the connection end 241 of the isolation metal element 240 and the ground metal element 210, and is configured to fine-tune the effective resonant length of the isolation metal element 240. The capacitance of the capacitor C is from about 1 pF to about 10 pF. Other features of the antenna system 302 of FIG. 3B are similar to those of the antenna system 200 of FIG. 2A. Accordingly, the two embodiments can achieve similar levels of performance.

Figure 3C:
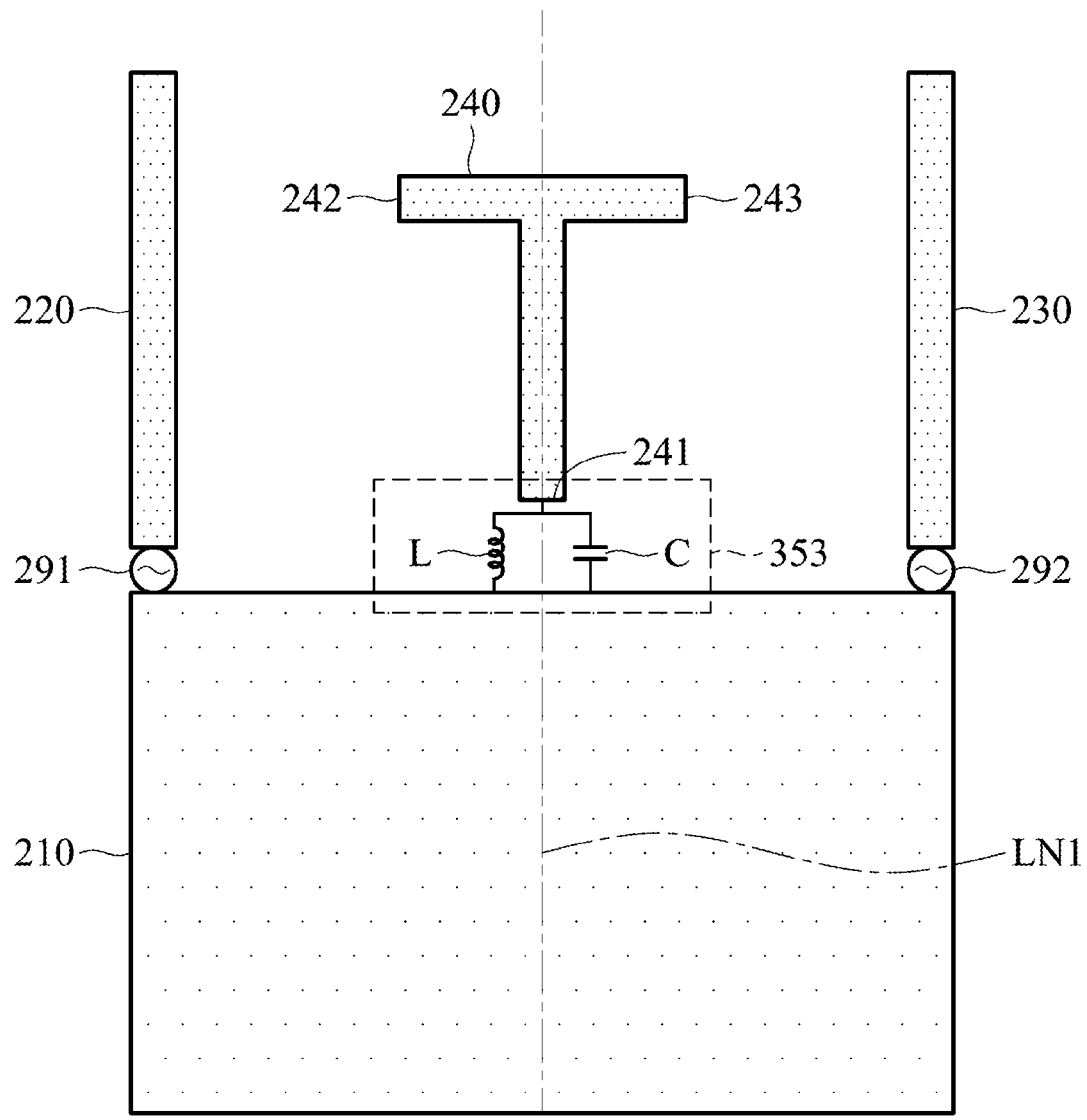
FIG. 3C is a diagram of an antenna system according to an embodiment of the invention.

FIG. 3C is a diagram of an antenna system 303 according to an embodiment of the invention. FIG. 3C is similar to FIG. 2A. In the embodiment of FIG. 3C, a matching circuit 353 of the antenna system 303 includes an inductor L and a capacitor C. The inductor L and the capacitor C are coupled in parallel between the connection end 241 of the isolation metal element 240 and the ground metal element 210, and are configured to fine-tune the effective resonant length of the isolation metal element 240. The inductance of the inductor L is from about 1 nH to about 20 nH. The capacitance of the capacitor C is from about 1 pF to about 10 pF. Other features of the antenna system 303 of FIG. 3C are similar to those of the antenna system 200 of FIG. 2A. Accordingly, the two embodiments can achieve similar levels of performance.

Figure 4:
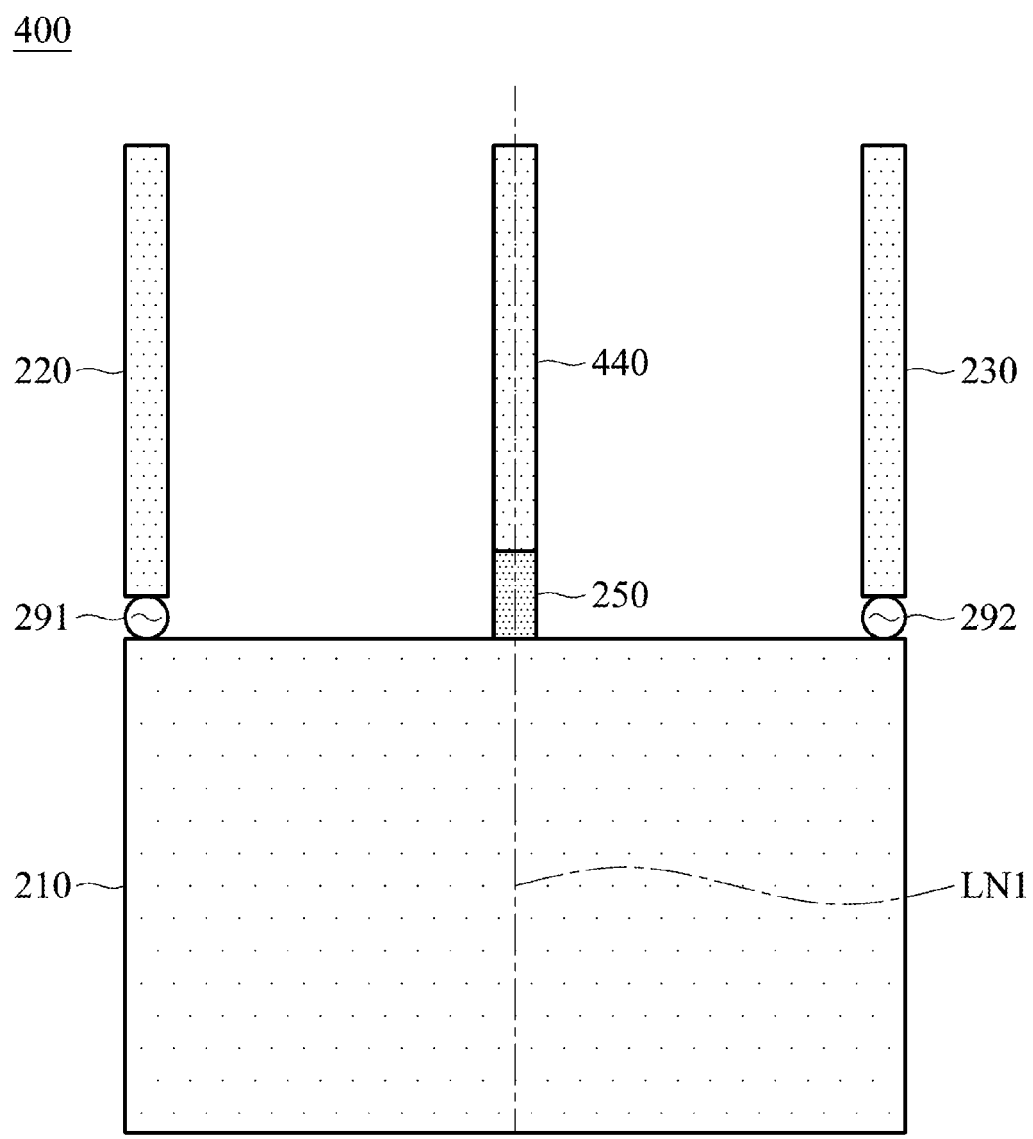
FIG. 4 is a diagram of an antenna system according to an embodiment of the invention.

FIG. 4 is a diagram of an antenna system 400 according to an embodiment of the invention. FIG. 4 is similar to FIG. 2A. In the embodiment of FIG. 4, an isolation metal element 440 of the antenna system 400 has a straight-line shape. Other features of the antenna system 400 of FIG. 4 are similar to those of the antenna system 200 of FIG. 2A. Accordingly, the two embodiments can achieve similar levels of performance.

Figure 5:
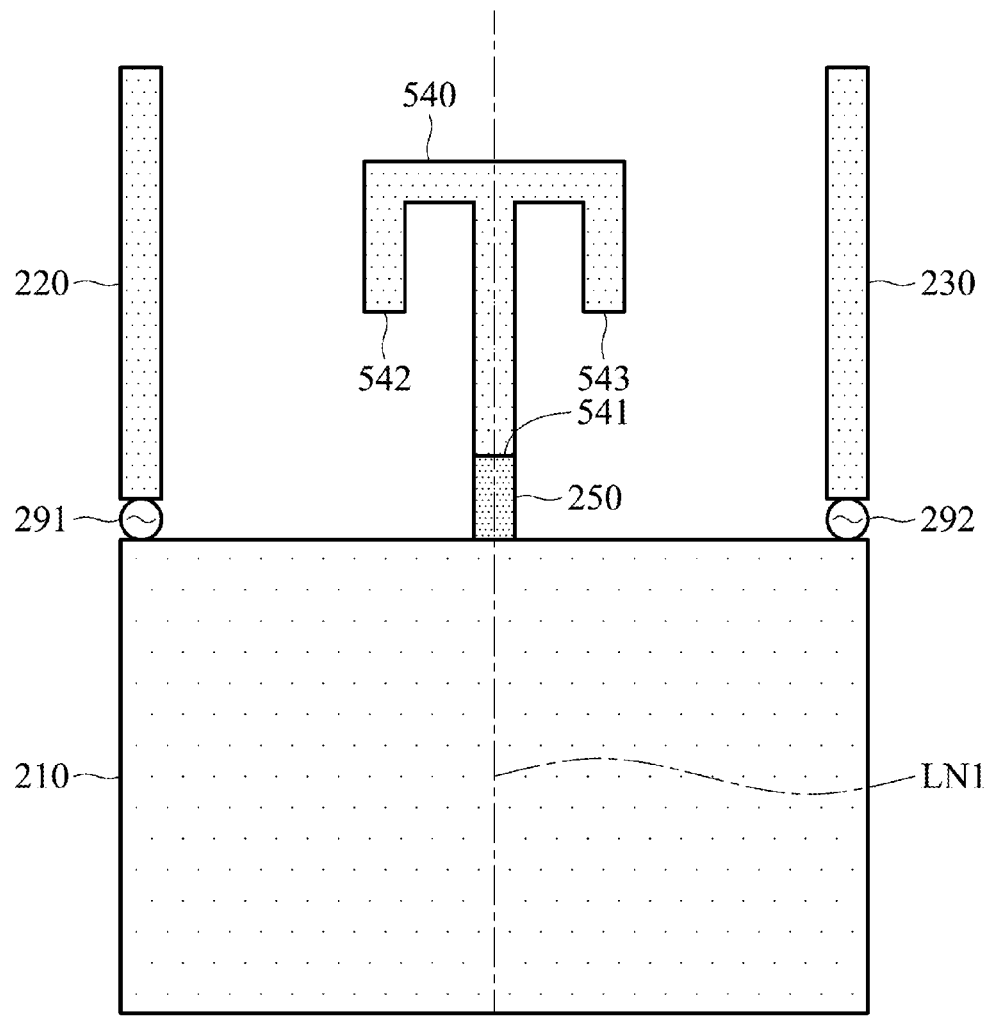
FIG. 5 is a diagram of an antenna system according to an embodiment of the invention.

FIG. 5 is a diagram of an antenna system 500 according to an embodiment of the invention. FIG. 5 is similar to FIG. 2A. In the embodiment of FIG. 5, an isolation metal element 540 of the antenna system 500 has a T-shape with bending ends. Specifically, the isolation metal element 540 has a connection end 541 and two open ends 542 and 543. The open ends 542 and 543 extend away from each other, and then they both extend toward the ground metal element 210, thereby minimizing the total area of the isolation metal element 540. Other features of the antenna system 500 of FIG. 5 are similar to those of the antenna system 200 of FIG. 2A. Accordingly, the two embodiments can achieve similar levels of performance.

Figure 6A:
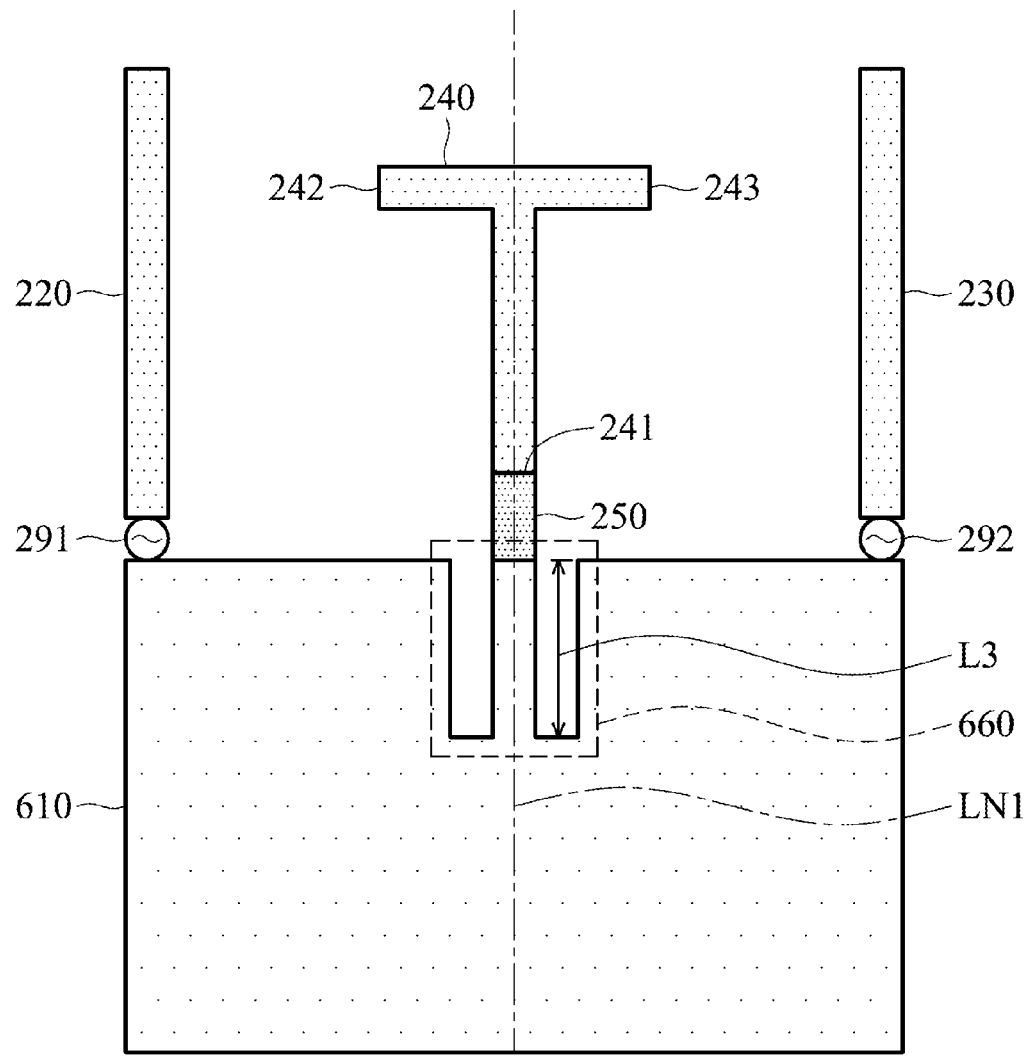
FIG. 6A is a diagram of an antenna system according to an embodiment of the invention.

FIG. 6A is a diagram of an antenna system 600 according to an embodiment of the invention. FIG. 6A is similar to FIG. 2A. In the embodiment of FIG. 6A, the antenna system 600 further includes a transmission line 660. The connection end 241 of the isolation metal element 240 is connected through the matching circuit 250 and the transmission line 660 to a ground metal element 610. For example, the transmission line 660 may be a CPW (Coplanar Waveguide), but it is not limited thereto. In alternative embodiments, the transmission line 660 is replaced with a microstrip line or a coaxial cable. The resonant frequency and the phase length of the isolation metal element 240 are adjustable by controlling the length L3 of the transmission line 660.

Figure 6B:
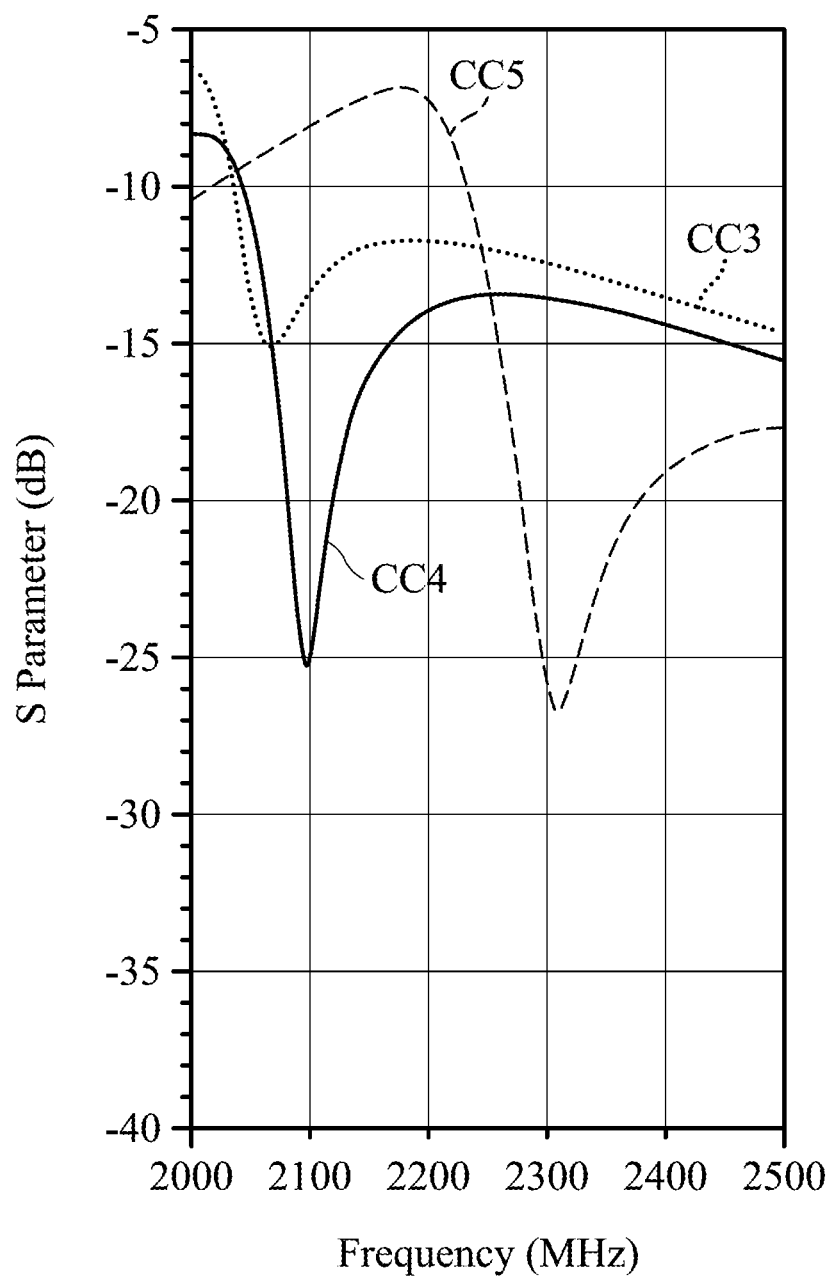
FIG. 6B is a diagram of S-parameters of an antenna system according to an embodiment of the invention.

FIG. 6B is a diagram of S-parameters of the antenna system 600 according to an embodiment of the invention. The horizontal axis represents the operation frequency (MHz), and the vertical axis represents the S-parameters (dB). If the first antenna 220 is set to a first port (Port 1) and the second antenna 230 is set to a second port (Port 2), the isolation between the first antenna 220 and the second antenna 230 will be represented by S21 (or S12) parameter. In the embodiment of FIG. 6B, the operation frequency band of the first antenna 220 and the second antenna 230 is substantially from 2400 MHz to 2484 MHz. A third curve CC3 represents the S21 parameter between the first antenna 220 and the second antenna 230 when the length L3 of the transmission line 660 is about 15 mm. A fourth curve CC4 represents the S21 parameter between the first antenna 220 and the second antenna 230 when the length L3 of the transmission line 660 is about 10 mm. A fifth curve CC5 represents the S21 parameter between the first antenna 220 and the second antenna 230 when the length L3 of the transmission line 660 is about 5 mm. According to the comparison between the third curve CC3, the fourth curve CC4, the fifth curve CC5, if the length L3 of the transmission line 660 increases, the resonant frequency band of the isolation metal element 240 may move toward a low frequency, and if the length L3 of the transmission line 660 decreases, the resonant frequency band of the isolation metal element 240 may move toward a high frequency. By controlling the length L3 of the transmission line 660, the isolation metal element 240 can resonate with the first antenna 220 and the second antenna 230 in the same frequency band. Other features of the antenna system 600 of FIG. 6A are similar to those of the antenna system 200 of FIG. 2A. Accordingly, the two embodiments can achieve similar levels of performance.

The following embodiments of FIGS. 7-10 show different applications and configurations of the proposed isolation metal element.

Figure 7:
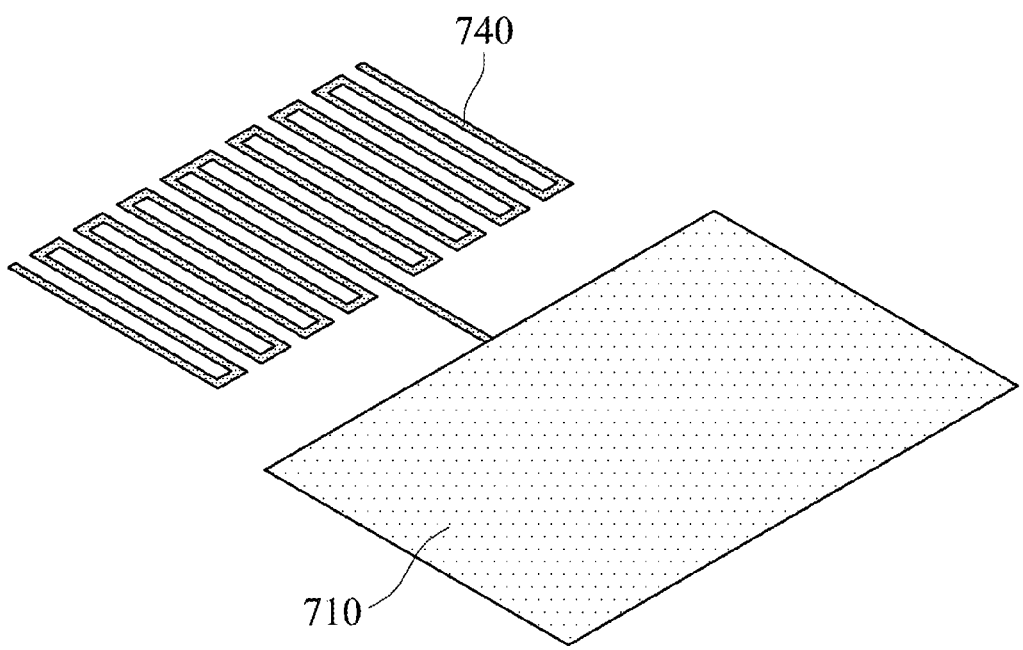
FIG. 7 is a diagram of an antenna system according to an embodiment of the invention.

FIG. 7 is a diagram of an antenna system 700 according to an embodiment of the invention. The antenna system 700 at least includes a ground metal element 710 and an isolation metal element 740. In the embodiment of FIG. 7, the isolation metal element 740 of the antenna system 700 has a meandering T-shape for operating in a relatively low frequency band (e.g., from 700 MHz to 800 MHz). The isolation metal element 740 is parallel to the ground metal element 710. It should be understood that the antenna system 700 may further include other elements, such as a first antenna, a second antenna, a first signal source, a second signal source, and a matching circuit, although they are not displayed in FIG. 7.

Figure 8:
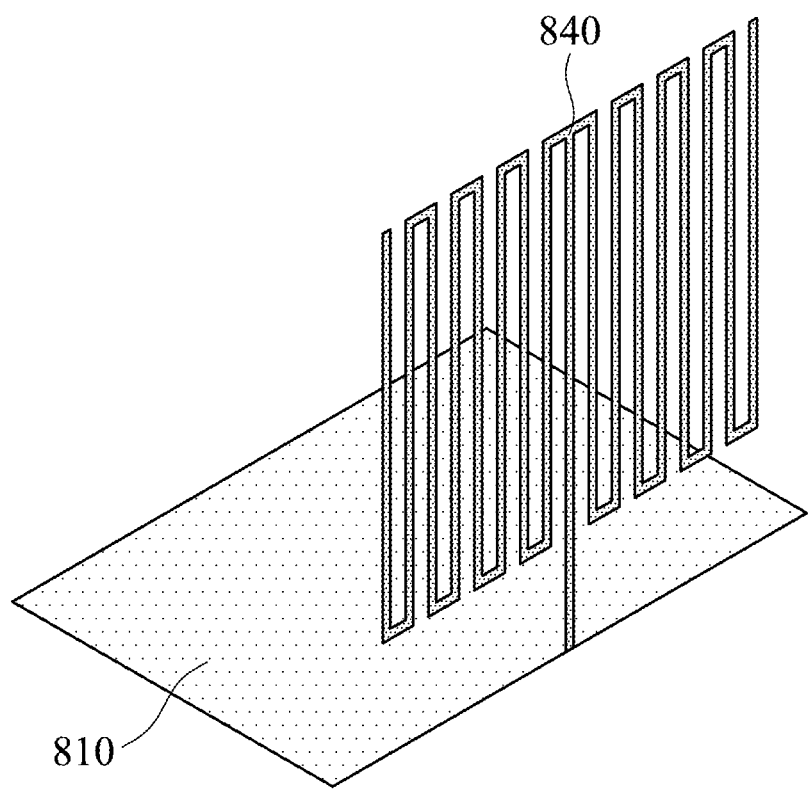
FIG. 8 is a diagram of an antenna system according to an embodiment of the invention.

FIG. 8 is a diagram of an antenna system 800 according to an embodiment of the invention. The antenna system 800 at least includes a ground metal element 810 and an isolation metal element 840. In the embodiment of FIG. 8, the isolation metal element 840 of the antenna system 800 has a meandering T-shape for operating in a relatively low frequency band (e.g., from 700 MHz to 800 MHz). The isolation metal element 840 is perpendicular to the ground metal element 810. It should be understood that the antenna system 800 may further include other elements, such as a first antenna, a second antenna, a first signal source, a second signal source, and a matching circuit, although they are not displayed in FIG. 8.

Figure 9:
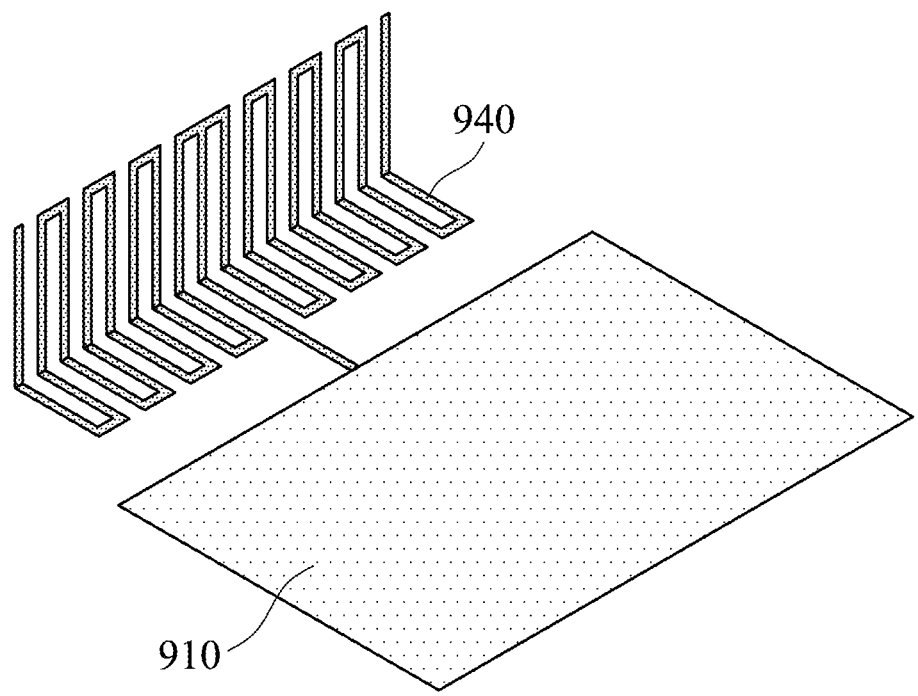
FIG. 9 is a diagram of an antenna system according to an embodiment of the invention.

FIG. 9 is a diagram of an antenna system 900 according to an embodiment of the invention. The antenna system 900 at least includes a ground metal element 910 and an isolation metal element 940. In the embodiment of FIG. 9, the isolation metal element 940 of the antenna system 900 has a meandering T-shape for operating in a relatively low frequency band (e.g., from 700 MHz to 800 MHz). At least one portion of the isolation metal element 940 is parallel to the ground metal element 910, and another portion of the isolation metal element 940 is perpendicular to the ground metal element 910. It should be understood that the antenna system 900 may further include other elements, such as a first antenna, a second antenna, a first signal source, a second signal source, and a matching circuit, although they are not displayed in FIG. 9.

Figure 10:
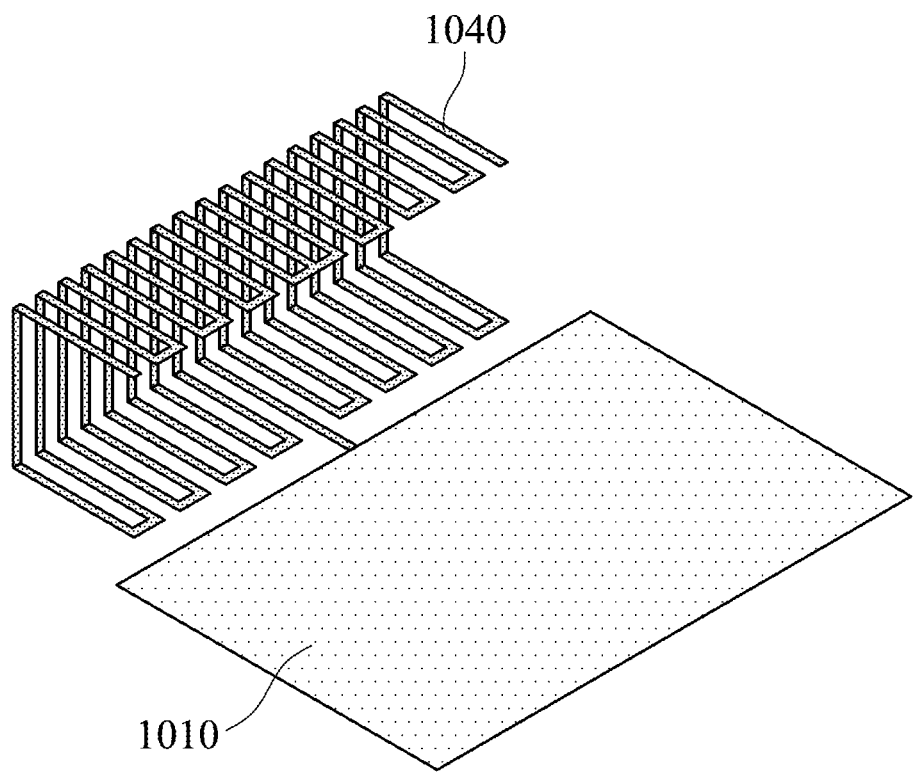
FIG. 10 is a diagram of an antenna system according to an embodiment of the invention.

FIG. 10 is a diagram of an antenna system 1000 according to an embodiment of the invention. The antenna system 1000 at least includes a ground metal element 1010 and an isolation metal element 1040. In the embodiment of FIG. 10, the isolation metal element 1040 of the antenna system 1000 has a meandering T-shape for operating in a relatively low frequency band (e.g., from 700 MHz to 800 MHz). At least two portions of the isolation metal element 1040 are parallel to each other, and another portion of the isolation metal element 1040 is perpendicular to the ground metal element 1010. It should be understood that the antenna system 1000 may further include other elements, such as a first antenna, a second antenna, a first signal source, a second signal source, and a matching circuit, although they are not displayed in FIG. 10.

Other features of the antenna systems 700, 800, 900, and 1000 of FIGS. 7-10 are similar to those of the antenna system 200 of FIG. 2A. Accordingly, these embodiments can achieve similar levels of performance.

In summary, the antenna system of the invention is capable of being operated in both low and high frequency bands. For example, the operation frequency band of the proposed antenna system can be from 700 MHz to 2700 MHz.

Note that the above element sizes, element shapes, and frequency ranges are not limitations of the invention. An antenna designer can fine-tune these settings or values according to different requirements. It should be understood that the antenna system of the invention is not limited to the configurations of FIGS. 1-6. The invention may merely include any one or more features of any one or more embodiments of FIGS. 1-6. In other words, not all of the features displayed in the figures should be implemented in the antenna system of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An antenna system, comprising:
a ground metal element;
a first signal source, connected to the ground metal element;
a first antenna, connected to the first signal source, wherein the first signal source is configured to excite the first antenna;
a second signal source, connected to the ground metal element;
a second antenna, connected to the second signal source, wherein the second signal source is configured to excite the second antenna;
an isolation metal element, disposed between the first antenna and the second antenna, and configured to improve isolation between the first antenna and the second antenna; and
a matching circuit, connected between the isolation metal element and the ground metal element;
wherein the isolation metal element has a connection end and an open end, and the connection end of the isolation metal element is connected through the matching circuit to the ground metal element;
wherein the antenna system further comprises:
a transmission line, wherein the connection end of the isolation metal element is connected through the matching circuit and the transmission line to the ground metal element, and the transmission line is configured to fine-tune a resonant frequency band of the isolation metal element.

2. The antenna system as claimed in claim 1, wherein the isolation metal element is symmetrical with respect to a central line of the antenna system.

3. The antenna system as claimed in claim 1, wherein the matching circuit comprises an inductor.

4. The antenna system as claimed in claim 1, wherein the matching circuit comprises a capacitor.

5. The antenna system as claimed in claim 1, wherein the isolation metal element has a T-shape, a straight-line shape, a T-shape with bending ends, an interdigitated shape, a spiral shape, or a meandering shape.

6. The antenna system as claimed in claim 1, wherein the first antenna and the second antenna cover a same operation frequency band.

7. The antenna system as claimed in claim 1, wherein any of the first antenna and the second antenna is a monopole antenna, a dipole antenna, a patch antenna, a loop antenna, a spiral antenna, a chip antenna, or a hybrid antenna.

8. The antenna system as claimed in claim 1, wherein the transmission line is a CPW (Coplanar Waveguide).

* * * * *